United States Patent [19]
Donohoe et al.

[11] Patent Number: 6,010,967
[45] Date of Patent: Jan. 4, 2000

[54] PLASMA ETCHING METHODS

[75] Inventors: Kevin G. Donohoe; Richard L. Stocks, both of Boise, Id.

[73] Assignee: Micron Technology, Inc., Boise, Id.

[21] Appl. No.: 09/083,764

[22] Filed: May 22, 1998

[51] Int. Cl.[7] .................................................. H01L 21/302
[52] U.S. Cl. ..................... 438/718; 438/714; 438/725; 438/905; 134/1.1; 134/1.2
[58] Field of Search .................... 438/714, 718, 438/725, 905; 134/1.1, 1.2

[56] References Cited

U.S. PATENT DOCUMENTS

| | | | |
|---|---|---|---|
| 4,222,838 | 9/1980 | Bhagat et al. | 204/192 E |
| 4,529,474 | 7/1985 | Fujiyama et al. | 156/643 |
| 5,129,994 | 7/1992 | Ebbing et al. | 156/643 |
| 5,298,466 | 3/1994 | Brasseur | 437/228 |
| 5,405,491 | 4/1995 | Shahvandi et al. | 156/643 |
| 5,585,012 | 12/1996 | Wu et al. | 216/71 |
| 5,780,359 | 7/1998 | Brown et al. | 438/659 |
| 5,814,155 | 11/1998 | Solis et al. | 134/1 |
| 5,817,534 | 10/1998 | Ye et al. | 438/10 |
| 5,824,607 | 10/1998 | Trow et al. | 438/732 |
| 5,869,401 | 2/1999 | Brunemeier et al. | 438/710 |
| 5,882,414 | 3/1999 | Fong et al. | 118/723 R |
| 5,904,778 | 5/1999 | Lu et al. | 118/723 R |
| 5,920,796 | 7/1999 | Wang et al. | 438/700 |

OTHER PUBLICATIONS

Product Bulletin, "TCP™9100 High–Density Oxide Etch System Productivity Solution For Advanced Oxide Etch", LAM Research Corporation, Fremont, CA 9 pages (undated).

*Primary Examiner*—Yogendra Gupta
*Assistant Examiner*—Christine Ingersoll
*Attorney, Agent, or Firm*—Well, St. John, Roberts, Gregory & Matkin P.S.

[57] ABSTRACT

In but one aspect of the invention, a plasma etching method includes forming polymer material over at least some internal surfaces of a dual powered plasma etch chamber while first plasma etching an outer surface of a semiconductor wafer received by a wafer holder within the chamber. After the first plasma etching, second plasma etching is conducted of polymer material from the chamber internal surfaces while providing a bias power at the wafer holder effective to produce an ac peak voltage at the wafer surface of greater than zero and less than 200 Volts. In one implementation, second plasma etching is conducted of polymer material from the chamber internal surfaces while providing a bias power at the wafer holder of greater than zero Watts and less or equal to about 1 Watt/cm$^2$ of wafer surface area on one side. In one implementation, second plasma etching is conducted of polymer material from the chamber internal surfaces with the wafer in the chamber while providing a bias power ratio of top to bottom power of at least about 10:1. In one implementation, plasma etching is conducted of polymer material from the chamber internal surfaces under conditions producing a greater etch rate of wafer outermost surfaces than an etch rate of the feature sidewall surfaces. In one implementation, plasma etching is conducted of polymer material from the chamber internal surfaces under conditions which also etch wafer outermost surfaces selectively relative to the feature sidewall surfaces.

3 Claims, 1 Drawing Sheet

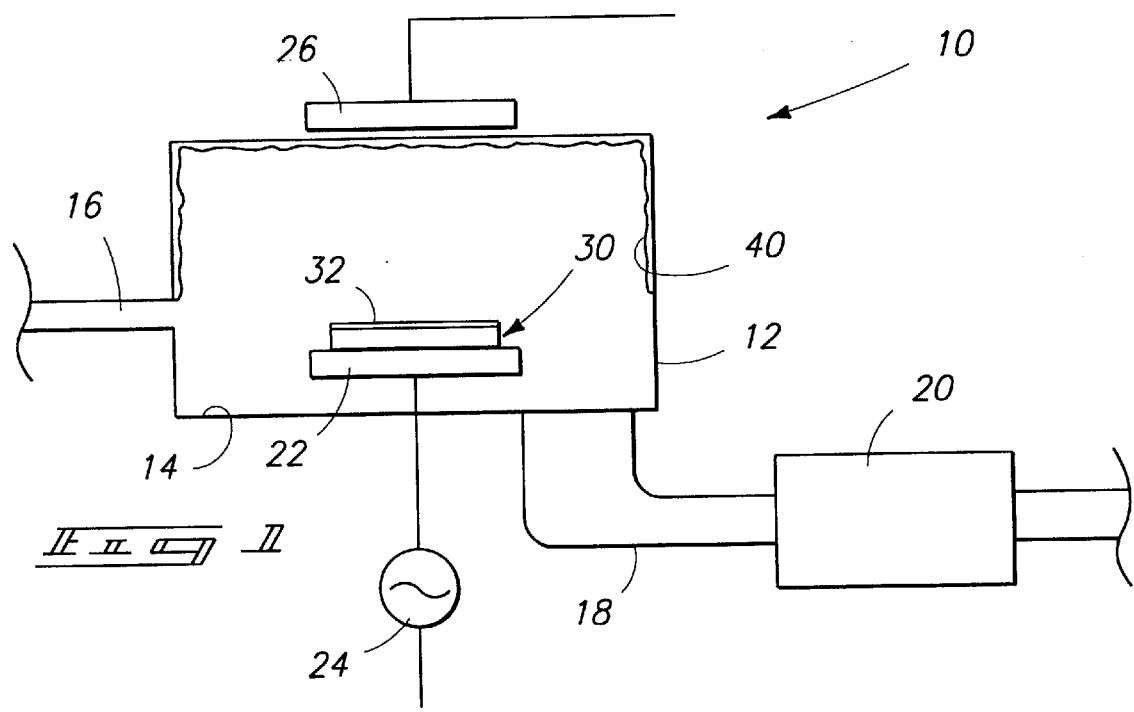
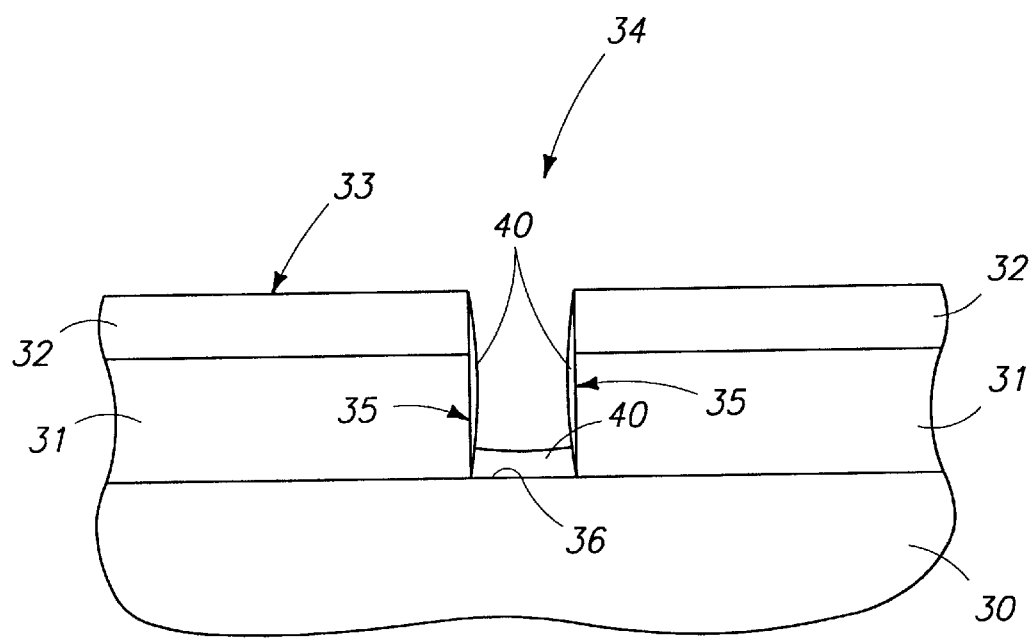

PLASMA ETCHING METHODS

TECHNICAL FIELD

This invention relates to plasma etching methods.

BACKGROUND OF THE INVENTION

Plasma etchers are commonly used in semiconductor wafer processing for fabrication of contact openings through insulating layers. A photoresist layer having contact opening patterns formed therethrough is typically formed over an insulative oxide layer, such as $SiO_2$ and doped $SiO_2$. An oxide etching gas, for example $CF_4$, is provided within the etcher and a plasma generated therefrom over the wafer or wafers being processed. The etching gas chemistry in combination with the plasma is ideally chosen to be highly selective to etch the insulating material through the photoresist openings in a highly anisotropic manner without appreciably etching the photoresist itself. A greater degree of anisotropy is typically obtained with such dry plasma etchings of contact openings than would otherwise occur with wet etching techniques.

One type of plasma etcher includes inductively coupled etching reactors. Such typically include an inductive plasma generating source coiled about or at the top of the reactor chamber and an electrostatic chuck within the chamber atop which one or more wafers being processed lies. The electrostatic chuck can be selectively biased as determined by the operator. Unfortunately when utilizing etching components having both carbon and fluorine, particularly in inductively coupled etching reactors, a polymer develops over much of the internal reactor sidewall surfaces. This polymer is electrically insulative and continually grows in thickness during the wafer etching process. In addition, the polymer can react with species in the plasma and cause process results to vary as the polymer thickness changes. For an etch 2 microns deep on the wafer, the polymer thickness on certain internal reactor surfaces can be 3000 Angstroms to 6000 Angstroms. It is highly desirable to remove this polymer because it can make process results vary and can contribute to particle contamination of the wafer(s) being processed.

The typical prior art process for cleaning this polymer material from the reactor employs a plasma etch utilizing $O_2$ as the etching gas. It is desirable that this clean occur at the conclusion of etching of the wafer while the wafer or wafers remain in situ within the reactor chamber. This both protects the electrostatic chuck (which is sensitive to particulate contamination) during the clean etch, and also maximizes throughput of the wafers being processed. An added benefit is obtained in that the oxygen plasma generated during the clean also has the effect of stripping the photoresist from over the previously etched wafer.

One prior art plasma clean is conducted in three steps when using a LAM 9100 type inductively coupled plasma etcher. In a first plasma cleaning step, top electrode power is provided at 600 Watts and the bottom at 200 Watts. $O_2$ feed is provided at 750 sccm for 15 seconds, with pressure being maintained at 15 mTorr. In the second step, top power is at 1750 Watts, the bottom electrode is not biased (0 Watts), and $O_2$ feed is provided at 500 sccm for 20 seconds with pressure being maintained at 80 mTorr. In a third step, the pins of the electrostatic chuck are raised to lift the wafer(s), and the top power is provided at 1200 Watts, the bottom electrode is not biased (0 Watts), and $O_2$ feed is provided at 500 sccm for 15 seconds with pressure being maintained at 80 mTorr.

However in the process of doing reactor clean etches, there is an approximate 0.025 micron or greater loss in the lateral direction of the contact. In other words, the contact openings within the insulating layer are effectively widened from the opening dimensions as initially formed. This results in an inherent increase in the critical dimension of the circuitry design. As contact openings become smaller, it is not expected that the photolithography processing will be able to adjust in further increments of size to compensate for this critical dimension loss.

Accordingly, it would be desirable to develop plasma etching methods which can be used to minimize critical dimension loss of contact openings, and/or achieve suitable reactor cleaning to remove the polymer from the internal surfaces of the etching chamber. Although the invention was motivated from this perspective, the artisan will appreciate other possible uses, with the invention only be limited by the accompanying claims appropriately interpreted in accordance with the Doctrine of Equivalents.

SUMMARY OF THE INVENTION

In but one aspect of the invention, a plasma etching method includes forming polymer material over at least some internal surfaces of a dual powered plasma etch chamber (for example a high density oxide etcher, where "high density" refers to a plasma density of at least $10^{10}$ ions/$cm^3$) while first plasma etching an outer surface of a semiconductor wafer received by a wafer holder within the chamber. After the first plasma etching, second plasma etching is conducted of polymer material from the chamber internal surfaces while providing a bias power at the wafer holder effective to produce an ac peak voltage at the wafer surface of greater than zero and less than 200 Volts. In one implementation, second plasma etching is conducted of polymer material from the chamber internal surfaces while providing a bias power at the wafer holder of greater than zero Watts and less or equal to about 1 Watt/$cm^2$ of wafer surface area on one side. In one implementation, second plasma etching is conducted of polymer material from the chamber internal surfaces with the wafer in the chamber while providing a bias power ratio of top to bottom power of at least about 10:1. In one implementation, plasma etching is conducted of polymer material from the chamber internal surfaces under conditions producing a greater etch rate of wafer outermost surfaces than an etch rate of the feature sidewall surfaces. In one implementation, plasma etching is conducted of polymer material from the chamber internal surfaces under conditions which also etch wafer outermost surfaces selectively relative to the feature sidewall surfaces. Other aspects and implementations are contemplated.

BRIEF DESCRIPTION OF THE DRAWINGS

Preferred embodiments of the invention are described below with reference to the following accompanying drawings.

FIG. 1 is a diagrammatic view of a plasma etcher utilized at one processing step in accordance with the invention.

FIG. 2 is an enlarged view of a fragment of a wafer during processing within the plasma etcher of FIG. 1.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been discovered that the polymer deposited on the internal walls of the etching chamber includes a significant concentration of fluorine. It has been recognized that the oxygen during the clean etching under plasma condition combines with the carbon and fluorine of the polymer liberated from the internal walls and forms carbon monoxide and carbon dioxide plus an activated or reactive fluorine containing species. Unfortunately, this fluorine containing species is also apparently reactive with the insulative oxide layer on the wafer, which is believed to result in more etching of such material and the widening of the contact openings.

Some of this polymer also gets deposited on the wafer during the etch. The polymer can deposit over the sidewalls within the etched openings to a thickness of about 200 Angstroms, typically being thicker over central portions of the sidewalls than at the base or top of the etched openings. The polymer can also deposit on the bottom of the contact during the overetch. Polymer thicknesses of up to 1500 Angstroms have been observed on the bottom of the contact. Presence of this polymer within the contact openings and its removal during subsequent oxide clean etching can also contribute to critical dimension loss. It has, however, been determined that polymer presence over the internal reactor surfaces is a greater contributing factor to critical dimension loss than polymer presence within the contact openings.

Referring to FIG. 1, a plasma etching reactor 10 includes a chamber 12 having internal surfaces 14. One or more gas inlets 16 and one or more gas outlets 18 are provided relative to etching chamber 12. A pump 20 is associated with outlet 18 for exhausting and establishing desired sub-atmospheric pressure conditions within chamber 12 during processing.

Plasma etching reactor 10 in the described embodiment is configured as an inductively coupled plasma etcher having a wafer receiver 22 within chamber 12 in the form of an electrostatic chuck. A biasing source 24 is electrically coupled with receiver 22. An inductive plasma inducing source 26 is diagrammatically shown externally at the top of chamber 12.

In accordance with the preferred embodiment, a semiconductor wafer 30 is positioned upon wafer receiver 22 within chamber 12. Wafer 30 has previously been processed to have a photoresist layer 32 formed on an insulative oxide layer 31 (FIG. 2) formed on the outer surface of wafer 30. Photoresist layer 32 has openings formed therein for forming features in the layer to be patterned. In the illustrated example, an illustrated opening in layer 32 is fabricated for formation of a feature in the form of a contact opening in insulative oxide layer 31. Alternate openings for fabrication of alternate features (i.e., conductive lines, other devices, etc.) could also of course be used. For purposes of the continuing discussion, wafer 30 has an outermost surface 33.

A desired vacuum pressure is established and maintained within chamber 12 utilizing vacuum pump 20. An example chamber pressure is from about 2 mTorr to about 200 mTorr. Inductively coupled source 26 and chuck 22 are appropriately biased to enable establishment of a desired plasma within and immediately over wafer 30. An example power range for inductively coupled source 26 is from 100 watts to about 2000 Watts, with wafer receiver 22 being negatively biased to an example of −200 to −600 Volts. Receiver 22 can have a temperature which is allowed to float, or otherwise be established and maintained at some range, for example from about −10° C. to about 40° C.

Desired etching gases are injected to within chamber 12 through inlet 16, or other inlets, to provide a desired etching gas from which an etching plasma is formed immediately over wafer 30. Such gas can comprise, for example, carbon and a halogen. An exemplary gas would be $CF_4$. Etching of wafer outer surfaces, for convenience referred to as a first plasma etching, is conducted for a selected time to etch desired contact openings, with one such opening 34 being shown in FIG. 2, within insulative oxide material 31 on semiconductor wafer 30 through the contact opening patterns formed within the photoresist layer 32. For purposes of the continuing discussion, such etching essentially forms feature sidewalls 35 and feature outer surface 36 from which feature sidewalls 35 extend. Unfortunately, a polymer layer 40 comprising carbon and the halogen, and in this example fluorine, forms over some of internal surfaces 14 of plasma etching chamber 12 during such etching. Such polymer can also form on the top of photoresist layer 32 (not specifically shown), with some polymer material 40 also forming over sidewalls 35, and over outer base surface 36, of contact/feature 34.

Such provides but one example of forming polymer material comprising carbon and a halogen over at least some internal surfaces of a plasma etch chamber. Where a 2 micron deep contact opening is being etched within insulative material 31, an exemplary average thickness of polymer material 40 formed over internal surfaces 14 is 3000 Angstroms. An exemplary maximum thickness of layer 40 formed within contact openings 34 is 200 Angstroms. An exemplary maximum thickness of the polymer deposition on the bottom of the contact is 1000 Angstroms. Thus, a thicker layer of the first polymer forms over internal surfaces of the chamber than over the semiconductor wafer.

After the first plasma etching, a second plasma etching is conducted of polymer material 40 from the chamber internal surfaces while providing, in one embodiment, the bias power at wafer holder 22 (preferably an electrostatic chuck) effective to produce an ac peak voltage at wafer surface 33 of greater than 0 Volts and less than 200 Volts. Preferably, bias power is provided during the second etching to be effective to produce an ac peak voltage at the wafer surface of less than or equal to about 150 volts. Most preferably, the bias power is provided at the wafer holder during the second etching to be effective to produce an ac peak voltage at wafer surface 33 of greater than or equal to about 25 volts and less than or equal to about 100 volts. For example in a LAM TCP 9100 reactor at a top power of 1000W, an applied bottom power for a typical 8-inch wafer to achieve an ac peak voltage at the wafer surface of from 100 Volts to 150 Volts is 500 W. The applied bottom power to achieve desired ac peak voltage can be impacted by top power and the volume of feature openings (or volume of steps adjacent island features) as compared to volume of generally horizontal surfaces over the wafer. Generally, higher applied top power reduces the required bottom power to achieve a given ac peak voltage at the wafer surface. Further generally, the greater the number of features formed on the wafer, the greater the required bottom power to achieve a given ac peak voltage at the wafer surface. Wafer holder 22 temperature is preferably maintained at from about 0° C. to about 20° C., with a chamber pressure preferably being maintained from about 10 mTorr to 500 mTorr. This second plasma etching typically comprises feeding $O_2$ to the reactor, for example at 750 sccm. Prior art processing as described above in the "Background" section produces either 0 Volt ac peak voltage at wafer surface 33 during etching (i.e. when the bottom electrode is not biased, i.e. at 0 Watts) or considerably greater than 200Volts (i.e., typically greater than 400 Volts) where the bottom electrode is biased at 200 Watts or greater.

In one desired attribute, plasma etching of polymer material 40 from chamber internal surfaces 14 is conducted under conditions which produce a greater etch rate of wafer outermost surfaces (such as surfaces 33 and the top of polymer material 40 received over feature surface 36) than an etch rate of feature sidewall surfaces formed by outermost surfaces of material 40 received over contacts sidewalls 35.

In another considered attribute, plasma etching of polymer material 40 from chamber internal surfaces 14 is conducted under conditions which also etch wafer outermost surfaces selectively relative to feature sidewall surfaces. In the context of this document, "selectively" means an etch of the outermost surfaces at a ratio of at least 1.5:1 compared to the sidewall surfaces. In a further considered attribute, second plasma etching of polymer material 40 is conducted from chamber internal surfaces 14 while providing a bias power at wafer holder 22 of greater than 0 Watts/cm$^2$ and less than or equal to about 1 Watt/cm$^2$ of wafer surface area on one wafer side. For example for an 8 inch wafer, which has surface area on one side equal to about 325 cm$^2$, applied power would preferably be less than or equal to about 325 Watts. More preferably, the bias power at the wafer holder during the second etching is provided at from about 0.15 Watt/cm$^2$ to about 0.65 Watt/cm$^2$ of wafer surface area on one side.

In yet a further considered attribute, second plasma etching of polymer material 40 is conducted from chamber internal surfaces 14 with wafer 30 received within the chamber while providing a bias power ratio of top electrode power 26 to bottom electrode power 22 of at least about 10:1. Even more preferred is to provide such ratio of at least about 20:1. In the illustrated example for an 8 inch wafer and using an LAM TCP 9100 reactor, an alternate example second plasma etching is conducted with a top electrode 26 power of 1750 Watts, and a bottom electrode power 22 of 150 Watts. AC peak voltage at the wafer surface in such example would be about 50 Volts.

It may be desired in some instances to introduce some intermediate plasma or other etching of photoresist layer 32 from wafer 30 between the above described first and second etchings at, for example, a bias power effective to produce an ac peak voltage at the wafer surface of greater than 200 Volts. Such might be conducted, for example, to achieve greater photoresist removal prior to the above stated second plasma etching.

Etching of the polymer material in the above described manners can restrict widening of the contact openings or other features resulting from further etching of material on the semiconductor wafer during the above described second plasma etching. Preferably, such etching restricts any widening of such contact openings to less than 0.010 micron, and even more preferably to less than 0.005 micron, resulting from further etching of material on the semiconductor wafer during the above described second plasma etching. Preferably, all of the above described etchings are conducted at subatmospheric pressure, with the wafer remaining in situ within the chamber intermediate the respective etchings. Further, the chamber is preferably maintained at subatmospheric pressure at all times intermediate the subject etchings.

The etching can be completed, if desired, utilizing the second and third step stated etchings, for example, provided in the background section of this document.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A plasma etching method comprising:

positioning a semiconductor wafer over an electrostatic chuck within an inductively coupled plasma etch chamber, the semiconductor wafer having a photoresist layer formed over an insulative oxide layer, the photoresist layer having contact opening patterns formed therethrough;

first plasma etching contact openings within the insulative oxide on the semiconductor wafer through the contact opening patterns formed in the photoresist layer with a gas comprising carbon and fluorine, a polymer comprising carbon and fluorine forming over at least some internal surfaces of the plasma etch chamber during the first plasma etching; and after the first plasma etching and with the wafer over the electrostatic chuck, second plasma etching polymer material from the chamber internal surfaces while providing the electrostatic chuck at a bias power effective to produce an ac peak voltage at the wafer surface of greater than zero and less than 150 Volts to restrict any widening of the contact openings formed in the insulative oxide to less than 0.010 micron resulting from further etching of the material on the semiconductor wafer during the second plasma etching.

2. The method of claim 1, wherein the first and second plasma etchings are conducted at subatmospheric pressure, with the wafer remaining in situ within the chamber intermediate the first and second etchings, and providing the chamber at a subatmospheric pressure at all time intermediate the first and second plasma etchings.

3. The method of claim 1, wherein ac peak voltage at the wafer surface is selected to restrict any widening of the contact openings formed in the insulative oxide to less than 0.005 micron resulting from further etching of the material on the semiconductor wafer during the second plasma etching.

\* \* \* \* \*